US009590012B2

(12) United States Patent
Lee et al.

(10) Patent No.: US 9,590,012 B2
(45) Date of Patent: Mar. 7, 2017

(54) SELF-ALIGNED CROSS-POINT PHASE CHANGE MEMORY-SWITCH ARRAY

(71) Applicant: Micron Technology, Inc., Boise, ID (US)

(72) Inventors: Jong Won Lee, San Francisco, CA (US); Gianpaolo Spadini, Los Gatos, CA (US); Derchang Kau, Cupertino, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 14/320,275

(22) Filed: Jun. 30, 2014

(65) Prior Publication Data
US 2015/0001458 A1 Jan. 1, 2015

Related U.S. Application Data

(60) Continuation of application No. 13/472,053, filed on May 15, 2012, now Pat. No. 8,765,581, which is a division of application No. 12/627,080, filed on Nov. 30, 2009, now abandoned.

(51) Int. Cl.
*H01L 27/108* (2006.01)
*H01L 27/24* (2006.01)
*H01L 45/00* (2006.01)

(52) U.S. Cl.
CPC ...... *H01L 27/2463* (2013.01); *H01L 27/2427* (2013.01); *H01L 45/06* (2013.01); *H01L 45/1233* (2013.01); *H01L 45/1253* (2013.01); *H01L 45/144* (2013.01); *H01L 45/1675* (2013.01)

(58) Field of Classification Search
CPC ............. H01L 27/2463; H01L 27/2481; H01L 27/2427; H01L 45/06; H01L 45/1233
USPC .......... 365/46, 163, 148, 175; 438/486, 182, 438/102, 103; 257/E27.006, E31.047, 257/E21.645
See application file for complete search history.

(56) References Cited

U.S. PATENT DOCUMENTS

| | | | |
|---|---|---|---|
| 4,809,044 A | 2/1989 | Pryor et al. | |
| 5,845,315 A * | 12/1998 | Cutter | 711/104 |
| 8,093,576 B1 | 1/2012 | Lee | |
| 2003/0090922 A1* | 5/2003 | Lowrey et al. | 365/100 |
| 2004/0100828 A1 | 5/2004 | Garney et al. | |
| 2005/0214953 A1 | 9/2005 | Lee et al. | |
| 2007/0297213 A1 | 12/2007 | Czubatyj et al. | |
| 2009/0001342 A1* | 1/2009 | Schricker et al. | 257/4 |
| 2009/0194756 A1* | 8/2009 | Kau | H01L 27/2427 257/3 |
| 2009/0269928 A1* | 10/2009 | Chang | H01L 27/2409 438/692 |
| 2010/0008124 A1 | 1/2010 | Scheuerlein et al. | |
| 2010/0163818 A1 | 7/2010 | Lee et al. | |
| 2010/0176368 A1 | 7/2010 | Ko et al. | |
| 2011/0002161 A1* | 1/2011 | Jin | G11C 13/0004 365/163 |

* cited by examiner

*Primary Examiner* — Kimberly Rizkallah
*Assistant Examiner* — Maria Ligai
(74) *Attorney, Agent, or Firm* — Holland & Hart LLP

(57) ABSTRACT

Subject matter disclosed herein relates to a memory device, and more particularly to a self-aligned cross-point phase change memory-switch array and methods of fabricating same.

14 Claims, 21 Drawing Sheets

SELF-ALIGNED CROSS-POINT PHASE CHANGE MEMORY-SWITCH ARRAY

REFERENCE TO RELATED APPLICATIONS

This application is a continuation of U.S. patent application Ser. No. 13/472,053, filed May 15, 2012, entitled "SELF-ALIGNED CROSS-POINT PHASE CHANGE MEMORY-SWITCH ARRAY;" which is a divisional of U.S. patent application Ser. No. 12/627,080, filed Nov. 30, 2009, entitled "SELF-ALIGNED CROSS-POINT PHASE CHANGE MEMORY-SWITCH ARRAY," now abandoned, each of which is hereby incorporated herein by reference in its entirety.

BACKGROUND

Field

Subject matter disclosed herein relates to a memory device, and more particularly to a self-aligned cross-point phase change memory-switch array and methods of fabricating same.

Information

Phase change memory may operate based, at least in part, on behavior and properties of one or more particular phase change materials, such as chalcogenide glass and/or germanium antimony telluride (GST), just to name a few examples. Crystalline and amorphous states of such materials may have different electrical resistivities, thus presenting a basis by which information may be stored. The amorphous, high resistance state may represent a stored first binary state and the crystalline, low resistance state may represent a stored second binary state. Of course, such a binary representation of stored information is merely an example: Phase change memory may also be used to store multiple memory states, represented by varying degrees of phase change material resistivity, for example.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a phase change memory-switch (PCMS) may comprise a plurality of PCMS cells arranged in an array. In particular, such an array of PCMS cells may be located at intersections of rows and columns of signal lines, thus forming a cross-point array structure. Accordingly, a memory controller, for example, may select a particular PCMS cell for a write, read, and/or erase operation by applying such an operation via a particular pair of row-column lines intersecting at an affected PCMS cell.

Figure 1:
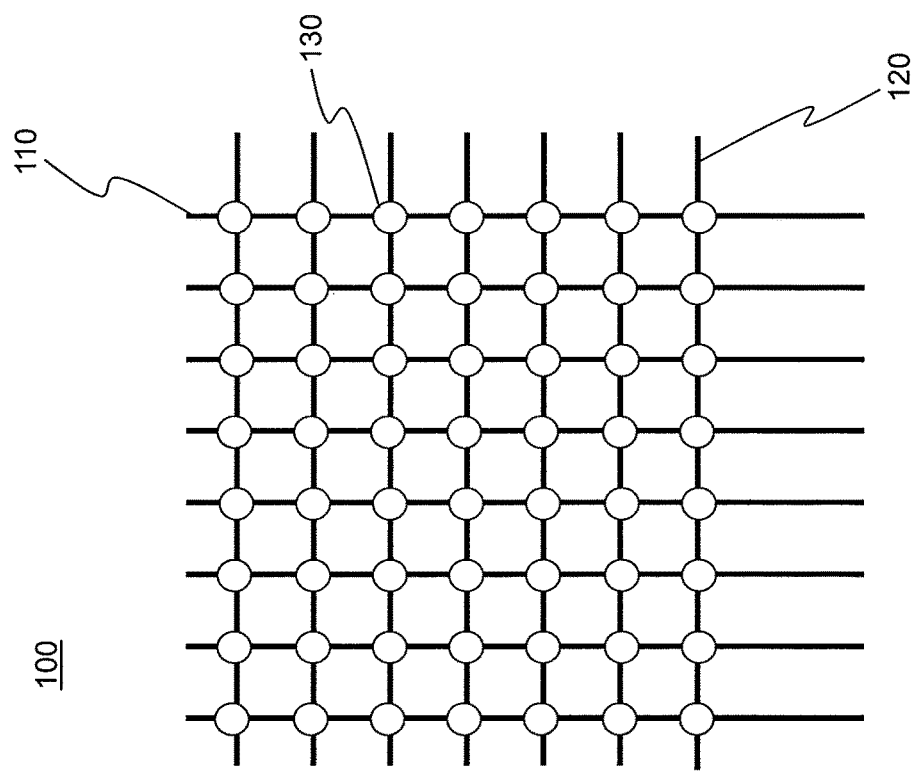
FIG. 1 is a schematic top view showing a cross-point array of phase change memory-switch (PCMS) cells, according to an embodiment.

FIG. 1 is a schematic top view showing a cross-point array 100 of PCMS cells 130 located at intersections of column signal lines 120 and row signal lines 110, according to an embodiment. Individual column and/or row signal lines may be electrically connected to a memory controller to selectively operate PCMS cells 130, for example.

Figure 2:
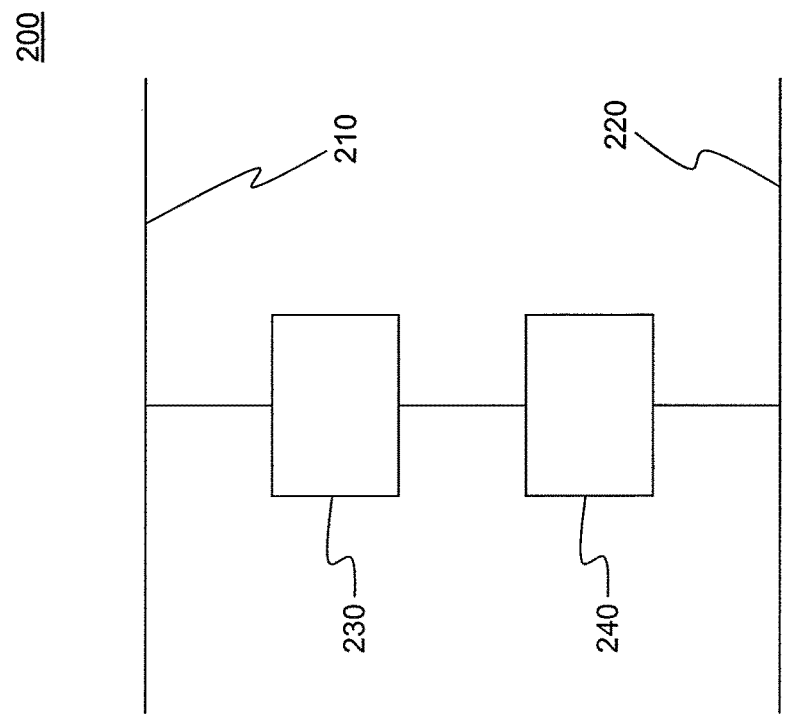
FIG. 2 is a schematic view showing a PCMS cell, according to an embodiment.

FIG. 2 is a schematic view showing a PCMS cell 200, according to an embodiment. PCMS cell 200 may comprise a specific example of PCMS cell 130 shown in FIG. 1, for example, though claimed subject matter is not so limited. PCMS cell 200 may comprise switch portion 230 and memory portion 240 electrically connected in series. In one implementation, switch portion 230 may be electrically connected and adjacent to column line 210 while memory portion 240 may be electrically connected and adjacent to row line 220. In another implementation, switch portion 230 may be electrically connected and adjacent to row line 220 while memory portion 240 may be electrically connected and adjacent to column line 210. Such implementations will be described in further detail below. Herein, the terms memory cell or PCMS cell means a structure that comprises a switch portion in series with a memory portion, such as shown in the example of FIG. 2, though claimed subject matter is not so limited. Such a switch portion may be operated by a memory controller to provide a relatively low impedance path to a connected memory portion, for example.

In an embodiment, a process to fabricate a PCMS cell may include using a first mask to mask a row metal layer covered with a memory material layer. The memory material layer and the row metal layer may be subsequently etched using the first etch mask to form first trenches between substantially parallel rows of the etched memory material layer and etched row metal layer. Such an etched memory material layer may result in a memory device or memory portion of a PCMS cell, for example. First trenches may then be filled with a first passivation material to form a first resulting structure that is subsequently covered with additional layers that will be etched to form a switch portion of a PCMS cell. Additional layers may be masked with a second etch mask to define substantially parallel columns that are substantially perpendicular to the rows described above. The additional layers may then be etched using the second etch mask to form second trenches between substantially parallel columns of the etched additional layers. Such etched additional layers may result in a switch device or switch portion of a PCMS cell, for example. Accordingly, such a process, which may involve merely two masking processes, may result in a self-aligned PCMS cell. Such a process may provide benefits including avoiding separate lithographic process for defining a memory portion and a switch portion. Further, such a process may be used to fabricate an array of PCMS cells in a cross-point configuration. In such an array, individual memory cells, including a memory portion and a switch portion electrically connected in series, may be formed between row and column lines. Thus, a process to fabricate such a relatively complex structure that may merely involve two masking processes leading to reduced fabrication cost and improved yield, for example.

Figure 3:
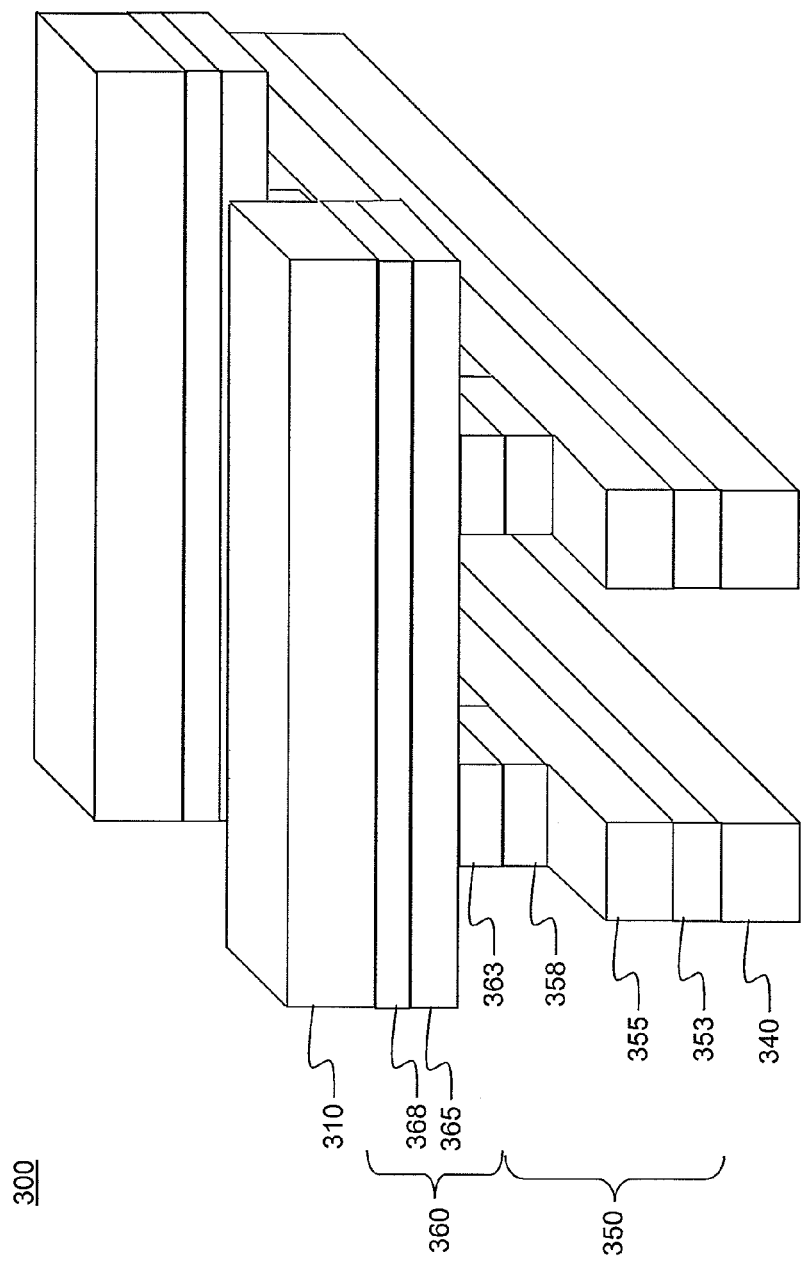
FIG. 3 is a schematic perspective view of multiple PCMS cells arranged in a portion of a cross-point array, according to an embodiment.

FIG. 3 is a schematic perspective view of multiple PCMS cells arranged in a portion 300 of a cross-point array, according to an embodiment. For example, such PCMS cells may be formed from a fabrication process described above and in further detail below. A PCMS cell may comprise a memory portion 350 adjacent to row lines 340 and a switch portion 360 adjacent to column lines 310. Row lines 340 and column lines 310, extending across a plurality of such PCMS cells, may carry electrical signals to/from a memory controller, memory write circuitry, and/or memory read circuitry (not shown) including sense amplifiers, for example. Row lines 340 may be substantially perpendicular to column lines 310 in a cross-point array, wherein a PCMS cell may be located at intersections of row lines 340 and column lines 310. Memory portion 350 may include a memory bottom electrode 353, a memory phase change material (PCM) 355, and a top memory electrode 358. Switch portion 360 may include a switch bottom electrode 363, a switch PCM 365, and a top switch electrode 368.

Figure 4:
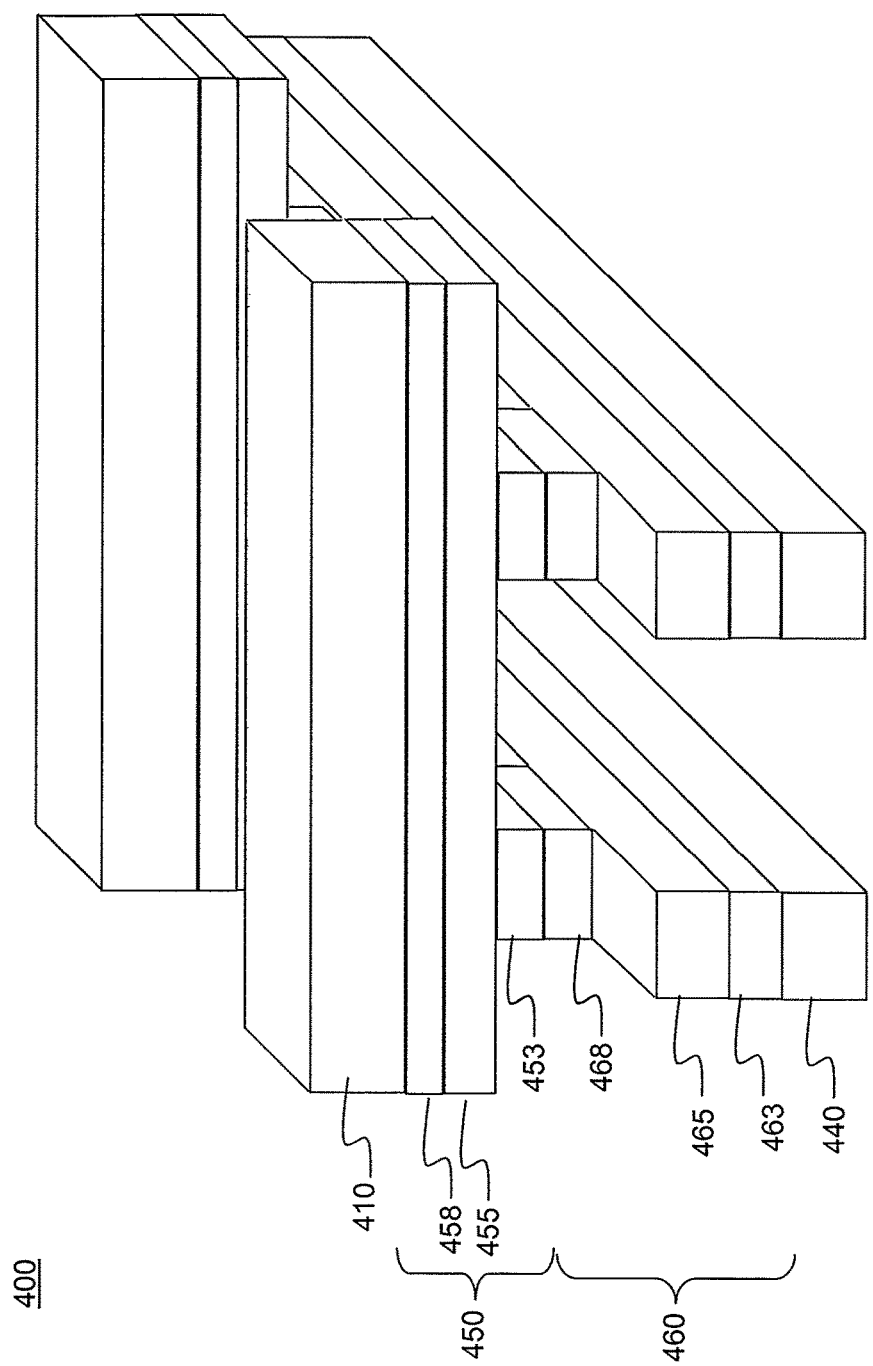
FIG. 4 is a schematic perspective view of multiple PCMS cells arranged in a portion of a cross-point array, according to another embodiment.

FIG. 4 is a schematic perspective view of multiple PCMS cells arranged in a portion 400 of a cross-point array, according to another embodiment. Such PCMS cells may be similar to PCMS cells shown in FIG. 3, for example, except that memory portion 450 may be adjacent to column lines 410 and switch portion 460 may be adjacent to row lines 440. Such PCMS cells may be formed from a fabrication process used to fabricate portion 300, except that particular materials for switch portion 460 may be deposited before those of memory portion 450, for example. As described for portion 300, row lines 440 and column lines 410, extending across a plurality of PCMS cells, may carry electrical signals to/from a memory controller, memory write circuitry and/or memory read circuitry (not shown) including sense amplifiers, for example. Row lines 440 may be substantially perpendicular to column lines 410 in a cross-point array. Memory portion 450 may include a memory bottom electrode 453, a memory PCM 455, and a top memory electrode 458. Switch portion 460 may include a switch bottom electrode 463, a switch PCM 465, and a top switch electrode 468. Of course, such details of cross-point array portions 300 and 400 are merely examples, and claimed subject matter is not so limited.

FIGS. 5-10 are schematic perspective views of PCMS cells, according to different embodiments. Differences between such illustrated embodiments may be directed to whether particular switch and/or memory material layers extend from a memory cell to beyond one or more neighboring memory cells. Thus, such differences may relate to varying degrees of isolation among neighboring PCMS cells, for example. As described in further detail below, applying different etching materials and/or etching times during fabrication processes, for example, may lead to such different embodiments. Also as described in further detail below, whether particular switch and/or memory material layers extend from a memory cell to beyond one or more neighboring memory cells may affect behavior of the memory cells. Such memory cell behavior may involve distribution and/or control of generated heat, electrical current, and/or parasitic memory cell parameters such as capacitance and so on. Regarding such illustrated embodiments, physical order with respect to switch and memory portions of memory cells may be interchanged based, at least in part, on an order of material deposition during fabrication processes. Accordingly, such physical order of embodiments illustrated herein may be reversed, though such alternate embodiments may not be shown herein.

Figure 5:
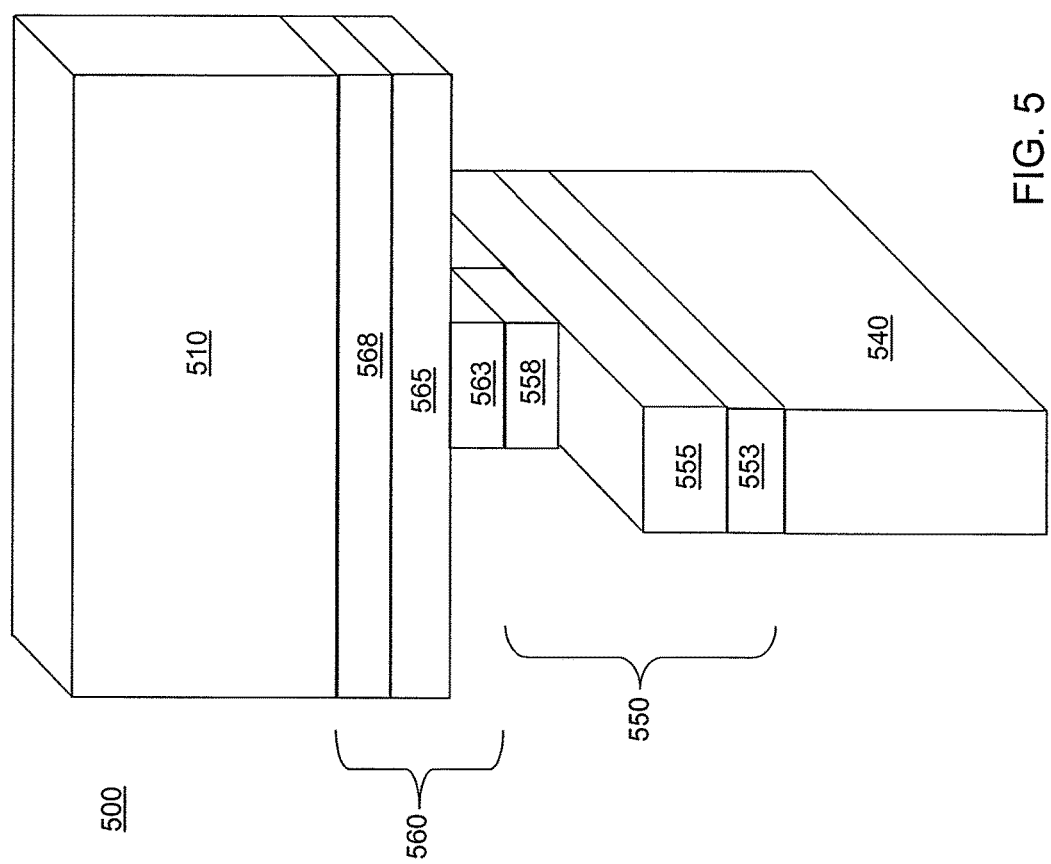
FIGS. 5-10 are schematic perspective views of PCMS cells, according to multiple embodiments.

FIG. 5 is a schematic perspective view of a PCMS cell 500, according to an embodiment. Such a cell may include at least a portion of row metal 540 and column metal 510, which may comprise signal lines that extend across a plurality of memory cells in a cross-point memory cell array. For example, such signal or control lines may carry electrical signals addressed to one or more particular memory cells and generated by a memory controller during write and/or read processes. In one implementation, row metal 540 and column metal 510 may comprise an electrically-conducting material such as gold, copper, aluminum, and so on. In another implementation, such electrically-conducting material may comprise a doped semiconductor, though claimed subject matter is not so limited. A memory portion 550 adjacent to row metal 540 may include a memory bottom electrode 553, memory PCM 555, and memory top electrode 558. Memory PCM 555 may comprise chalcogenide glass and/or germanium antimony telluride (GST), for example. Memory bottom and/or top electrodes may comprise titanium nitride (TiN), platinum or other noble metals, and/or carbon, just to name a few examples. A switch portion 560 adjacent to column metal 510 may include a switch bottom electrode 563, switch PCM 565, and switch top electrode 568. Switch PCM 565 may comprise chalcogenide glass and/or GST, for example. Switch bottom and/or top electrodes may comprise titanium nitride (TiN), platinum or other noble metals, and/or carbon, just to name a few examples. Memory bottom electrode 553, memory PCM 555, switch PCM 565, and/or switch top electrode 568 may extend from PCMS cell 500 to beyond one or more neighboring memory cells along row metal 540 and column metal 510, respectively. Accordingly, memory top electrode 558 and/or switch bottom electrode 563 may be isolated from such neighboring memory cells. A relatively high density electrical current may be generated inside memory top electrode 558 and/or adjacent portions of PCMS 500 that are relatively close to memory top electrode 558. Thus, for example, phase change action during operation of PCMS 500 may occur near an interface between the memory PCM 555 and the memory top electrode 558. Of course, such details of PCMS cell 500 are merely examples, and claimed subject matter is not so limited.

Figure 6:
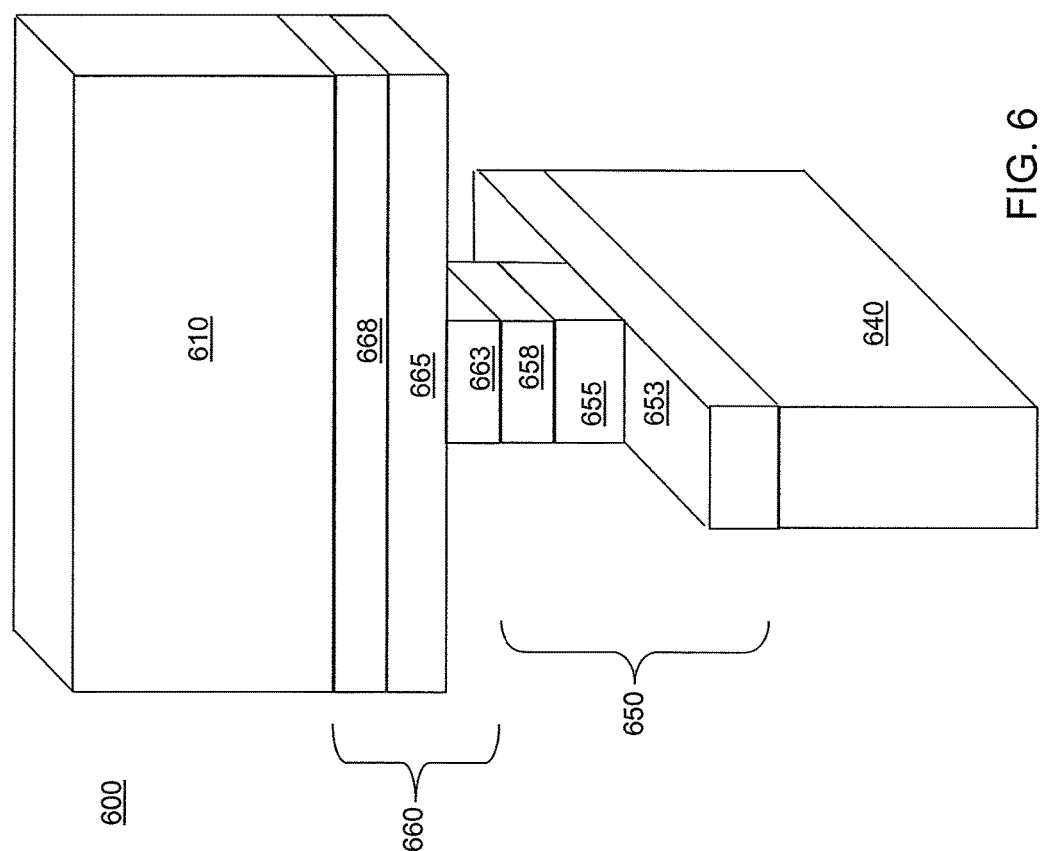

FIG. 6 is a schematic perspective view of a PCMS cell 600, according to an embodiment. Such a cell may include at least a portion of row metal 640 and column metal 610, which may comprise signal lines that extend across a plurality of memory cells in a cross-point memory cell array. A memory portion 650 adjacent to row metal 640 may include a memory bottom electrode 653, memory PCM 655, and memory top electrode 658. A switch portion 660 adjacent to column metal 610 may include a switch bottom electrode 663, switch PCM 665, and switch top electrode 668. Memory bottom electrode 653, switch PCM 665, and/or switch top electrode 668 may extend from PCMS cell 600 to beyond one or more neighboring memory cells along row metal 640 and column metal 610, respectively. On the other hand, memory PCM 655, memory top electrode 658, and/or switch bottom electrode 663 may not extend from PCMS cell 600 to beyond one or more neighboring memory cells. Accordingly, memory PCM 655, memory top electrode 658, and/or switch bottom electrode 663 may be physically separated and isolated from such neighboring memory cells. A relatively high density electrical current may be generated inside memory PCM 655. Thus, heat generation and phase change action during operation of PCMS 600 may occur throughout PCMS 600. In an implementation, materials having particular electrical and/or thermal properties may be selected for top and bottom memory electrodes in order to adjust a temperature profile within PCMS 600. Such adjustment, for example, may be used in a process to optimize performance of a memory device that includes PCMS 600. Of course, such details of PCMS cell 600 are merely examples, and claimed subject matter is not so limited.

Figure 7:
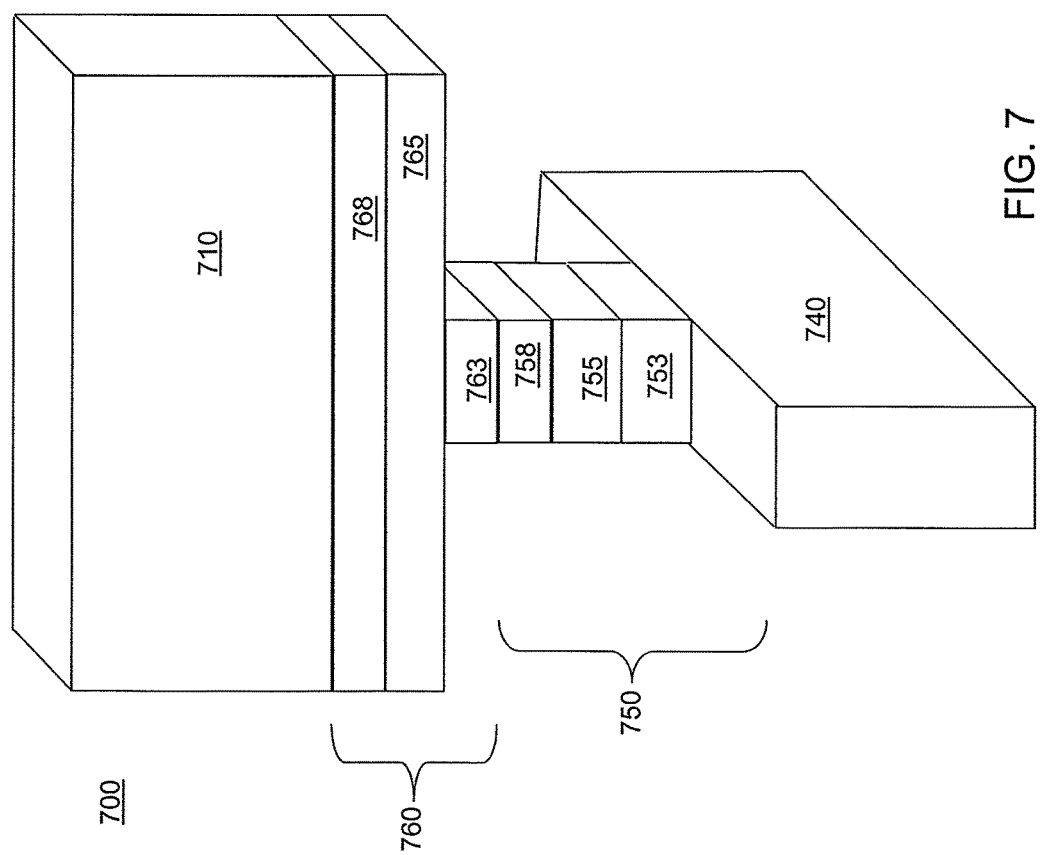

FIG. 7 is a schematic perspective view of a PCMS cell 700, according to an embodiment. Such a cell may include at least a portion of row metal 740 and column metal 710, which may comprise signal lines that extend across a plurality of memory cells in a cross-point memory cell array. A memory portion 750 adjacent to row metal 740 may include a memory bottom electrode 753, memory PCM 755, and memory top electrode 758. A switch portion 760 adjacent to column metal 710 may include a switch bottom electrode 763, switch PCM 765, and switch top electrode 768. Switch PCM 765 and/or switch top electrode 768 may extend from PCMS cell 700 to beyond one or more neighboring memory cells along column metal 710. On the other hand, memory bottom electrode 753, memory PCM 755, memory top electrode 758, and/or switch bottom electrode 763 may not extend from PCMS cell 700 to beyond one or more neighboring memory cells. Accordingly, memory bottom electrode 753, memory PCM 755, memory top electrode 758, and/or switch bottom electrode 763 may be physically separated and be isolated from such neighboring memory cells. A relatively high density electrical current may be generated inside memory PCM 755, memory top electrode 758, and/or memory bottom electrode 753. Electrical current in memory bottom electrode 753 may be relatively isolated among neighboring memory cells, thus providing an improved ability, relative to embodiments described above, for example, to adjust a temperature profile within PCMS 700 by altering electrode material. Of course, such details of PCMS cell 700 are merely examples, and claimed subject matter is not so limited.

Figure 8:
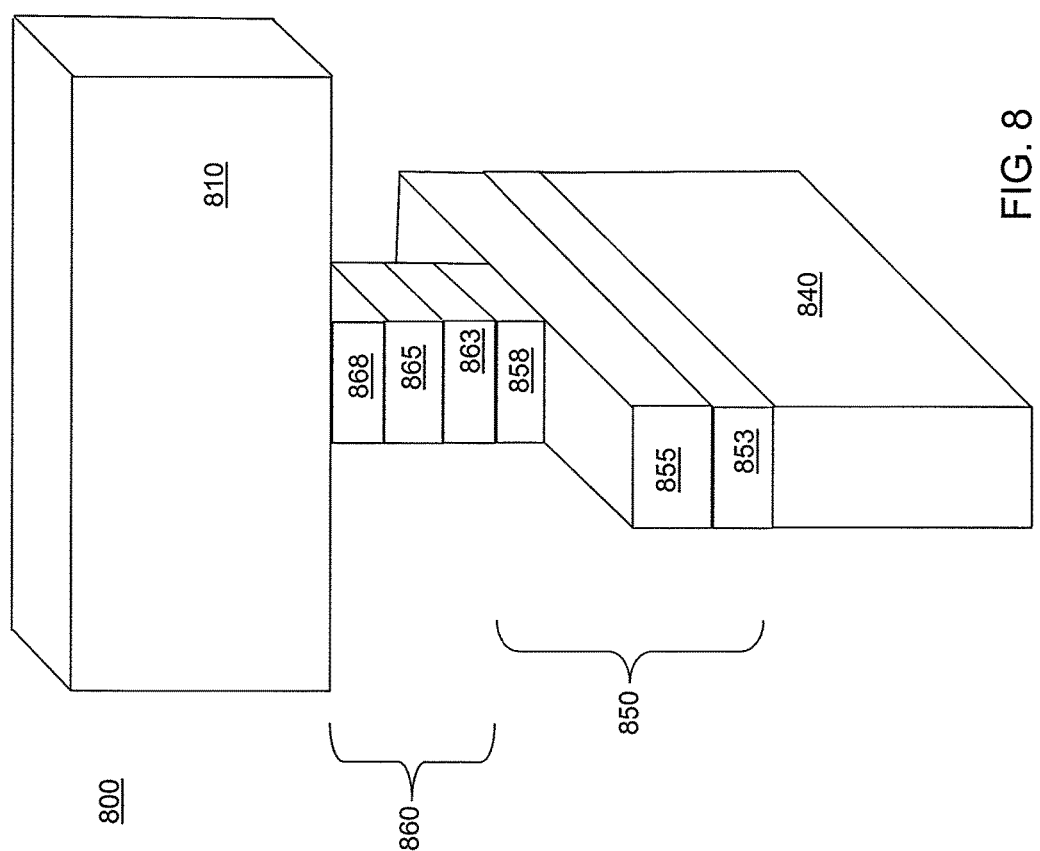

FIG. 8 is a schematic perspective view of a PCMS cell 800, according to an embodiment. Such a cell may include at least a portion of row metal 840 and column metal 810, which may comprise signal lines that extend across a plurality of memory cells in a cross-point memory cell array. A memory portion 850 adjacent to row metal 840 may include a memory bottom electrode 853, memory PCM 855, and memory top electrode 858. A switch portion 860 adjacent to column metal 810 may include a switch bottom electrode 863, switch PCM 865, and switch top electrode 868. Memory bottom electrode 853 and/or memory PCM 855 may extend from PCMS cell 800 to beyond one or more neighboring memory cells along row metal 840. On the other hand, memory top electrode 858, switch bottom electrode 863, switch PCM 865, and/or switch top electrode 868 may not extend from PCMS cell 800 to beyond one or more neighboring memory cells. Accordingly, memory top electrode 858, switch bottom electrode 863, switch PCM 865, and/or switch top electrode 868 may be physically separated and isolated from such neighboring memory cells. Of course, such details of PCMS cell 800 are merely examples, and claimed subject matter is not so limited.

Figure 9:
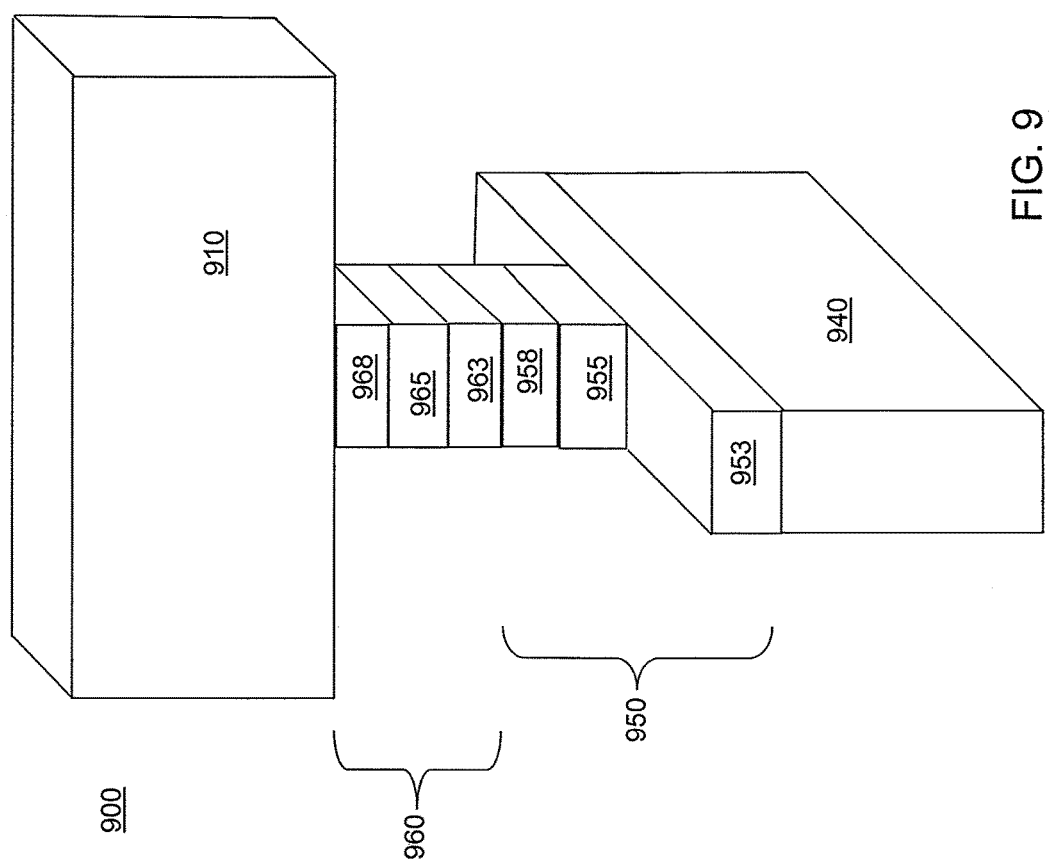

FIG. 9 is a schematic perspective view of a PCMS cell 900, according to an embodiment. Such a cell may include at least a portion of row metal 940 and column metal 910, which may comprise signal lines that extend across a plurality of memory cells in a cross-point memory cell array. A memory portion 950 adjacent to row metal 940 may include a memory bottom electrode 953, memory PCM 955, and memory top electrode 958. A switch portion 960 adjacent to column metal 910 may include a switch bottom electrode 963, switch PCM 965, and switch top electrode 968. Memory bottom electrode 953 may extend from PCMS cell 900 to beyond one or more neighboring memory cells along row metal 940. On the other hand, memory PCM 955, memory top electrode 958, switch bottom electrode 963, switch PCM 965, and/or switch top electrode 968 may not extend from PCMS cell 900 to beyond one or more neighboring memory cells. Accordingly, memory PCM 955, memory top electrode 958, switch bottom electrode 963, switch PCM 965, and/or switch top electrode 968 may be physically separated and isolated from such neighboring memory cells. Of course, such details of PCMS cell 900 are merely examples, and claimed subject matter is not so limited.

Figure 10:
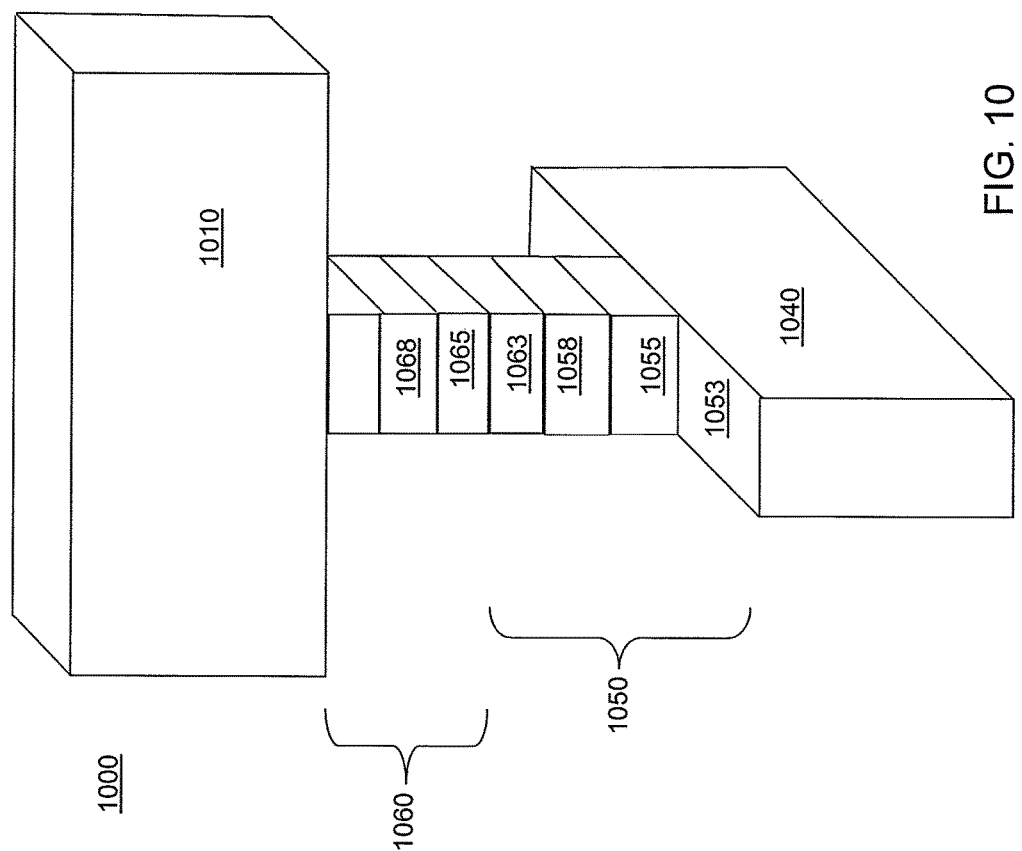

FIG. 10 is a schematic perspective view of a PCMS cell 1000, according to an embodiment. Such a cell may include at least a portion of row metal 1040 and column metal 1010, which may comprise signal lines that extend across a plurality of memory cells in a cross-point memory cell array. A memory portion 1050 adjacent to row metal 1040 may include a memory bottom electrode 1053, memory PCM 1055, and memory top electrode 1058. A switch portion 1060 adjacent to column metal 1010 may include a switch bottom electrode 1063, switch PCM 1065, and switch top electrode 1068. In contrast to embodiments described above, portions of memory portion 1050 and/or switch portion 1060 may not extend from PCMS cell 1000 to beyond one or more neighboring memory cells. On the other hand, memory bottom electrode 1053, memory PCM 1055, memory top electrode 1058, switch bottom electrode 1063, switch PCM 1065, and/or switch top electrode 1068 may not extend from PCMS cell 1000 to beyond one or more neighboring memory cells. Accordingly, memory bottom electrode 1053, memory PCM 1055, memory top electrode 1058, switch bottom electrode 1063, switch PCM 1065, and/or switch top electrode 1068 may be physically separated and isolated from such neighboring memory cells. Of course, such details of PCMS cell 1000 are merely examples, and claimed subject matter is not so limited.

Figure 11:
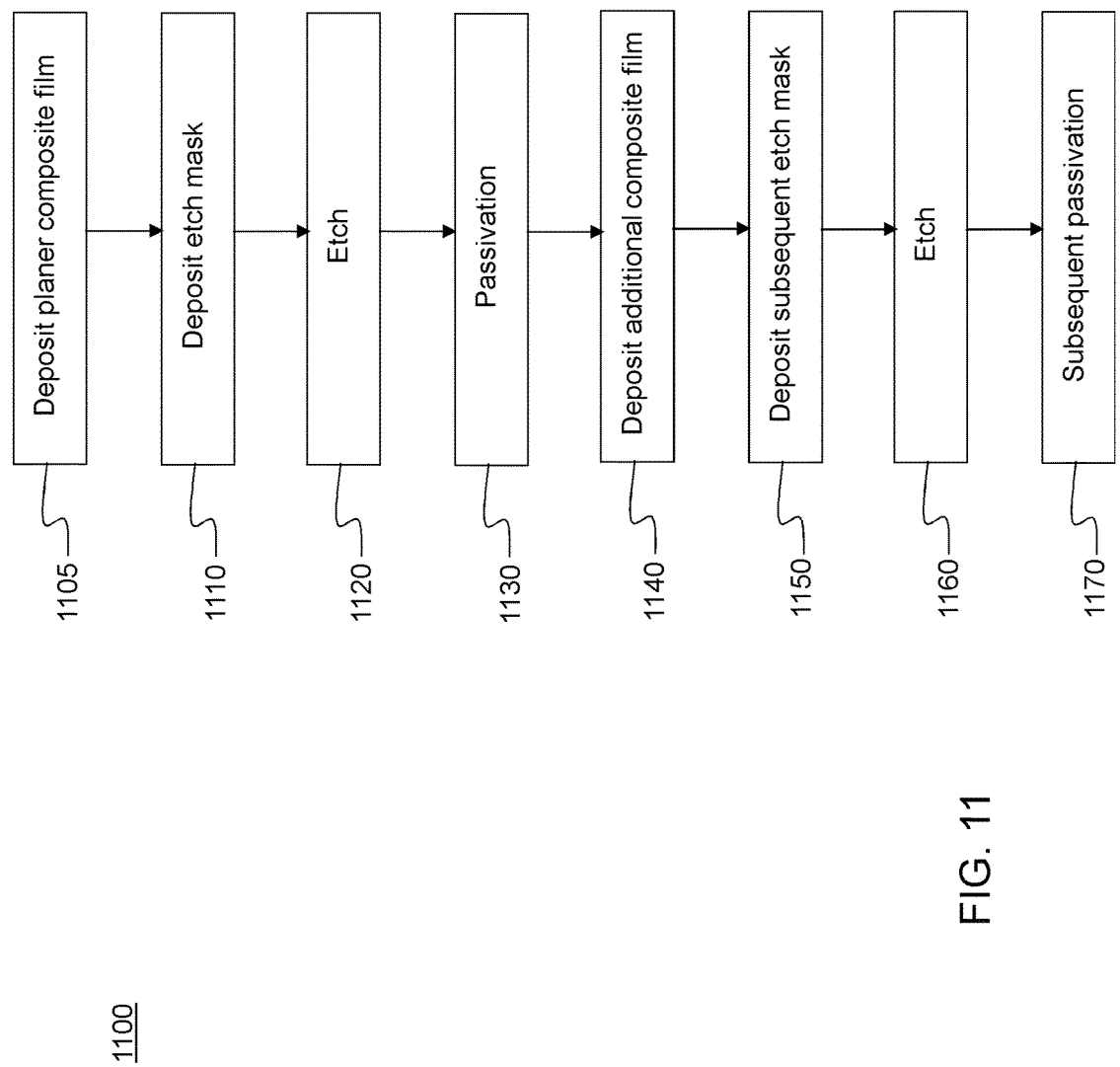
FIG. 11 is a flow diagram of a process for fabricating a PCMS cell, according to an embodiment.
Figure 12:
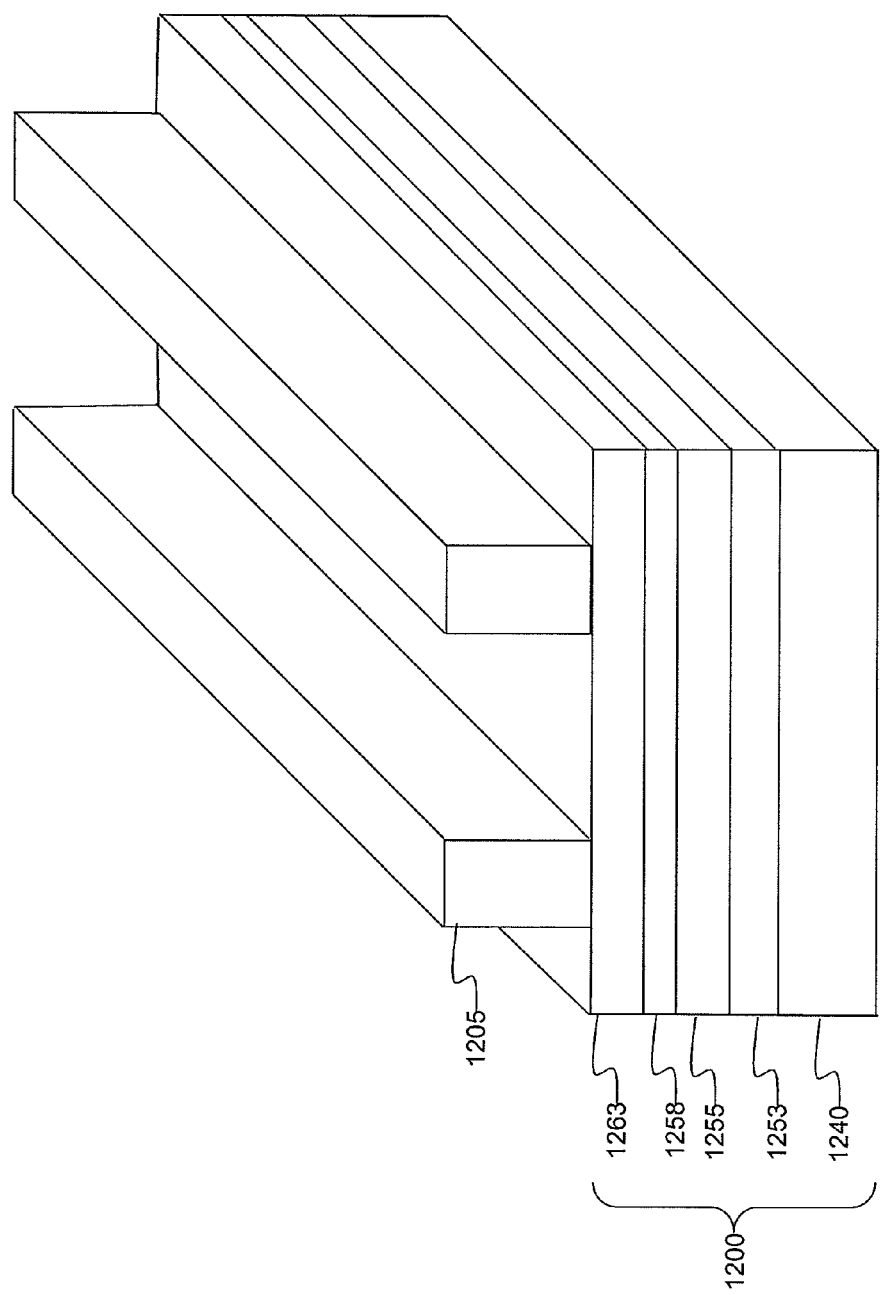
FIGS. 12-20 are schematic perspective views showing structures resulting from various portions of a process to fabricate a PCMS cell, according to an embodiment.

FIG. 11 is a flow diagram of a fabrication process 1100, according to an embodiment. At block 1105, a planer composite film comprising row metal 1240, memory bottom electrode 1253, memory PCM 1255, memory top electrode 1258, and either switch bottom electrode or sacrificial material 1263 may be deposited (FIG. 12). In one particular implementation, material for switch bottom electrode or sacrificial material 1263 may be relatively resistant to a subsequent chemical-mechanical polish process. Details and benefits of using such a sacrificial material will be described below. At block 1110, an etch mask may be deposited and patterned into set of etch mask lines 1205, resulting in a masked film stack 1200 shown in FIG. 12, for example. Such an etch mask may comprise a photoresist, a dielectric, or other material that is relatively easy to etch into a line pattern, for example. Patterning may be performed using photolithography (e.g., direct print, expose/shift/expose, expose/positive develop/negative develop), photolithography with pitch doubling process (e.g., spacers), and imprinting, just to name a few examples.

Figure 13:
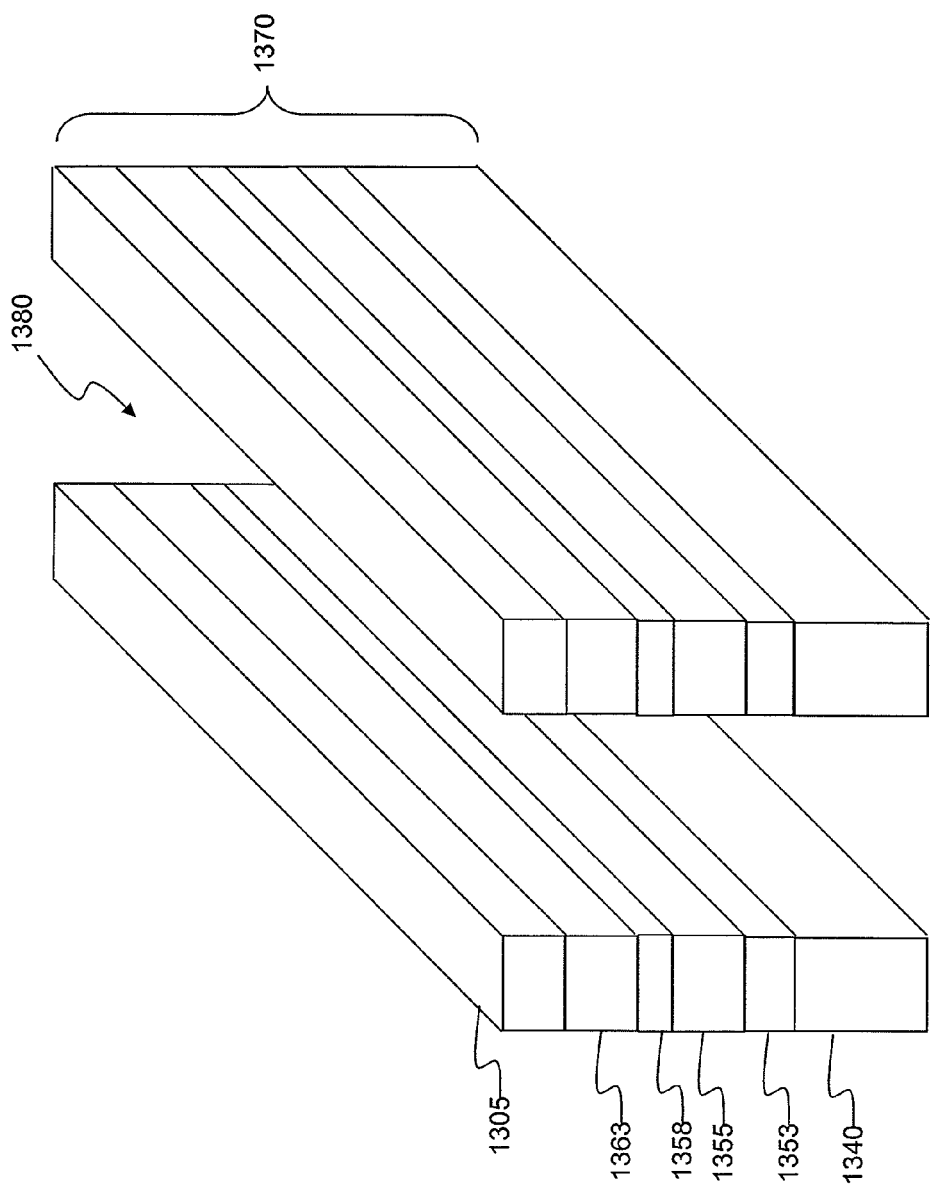
Figure 14:
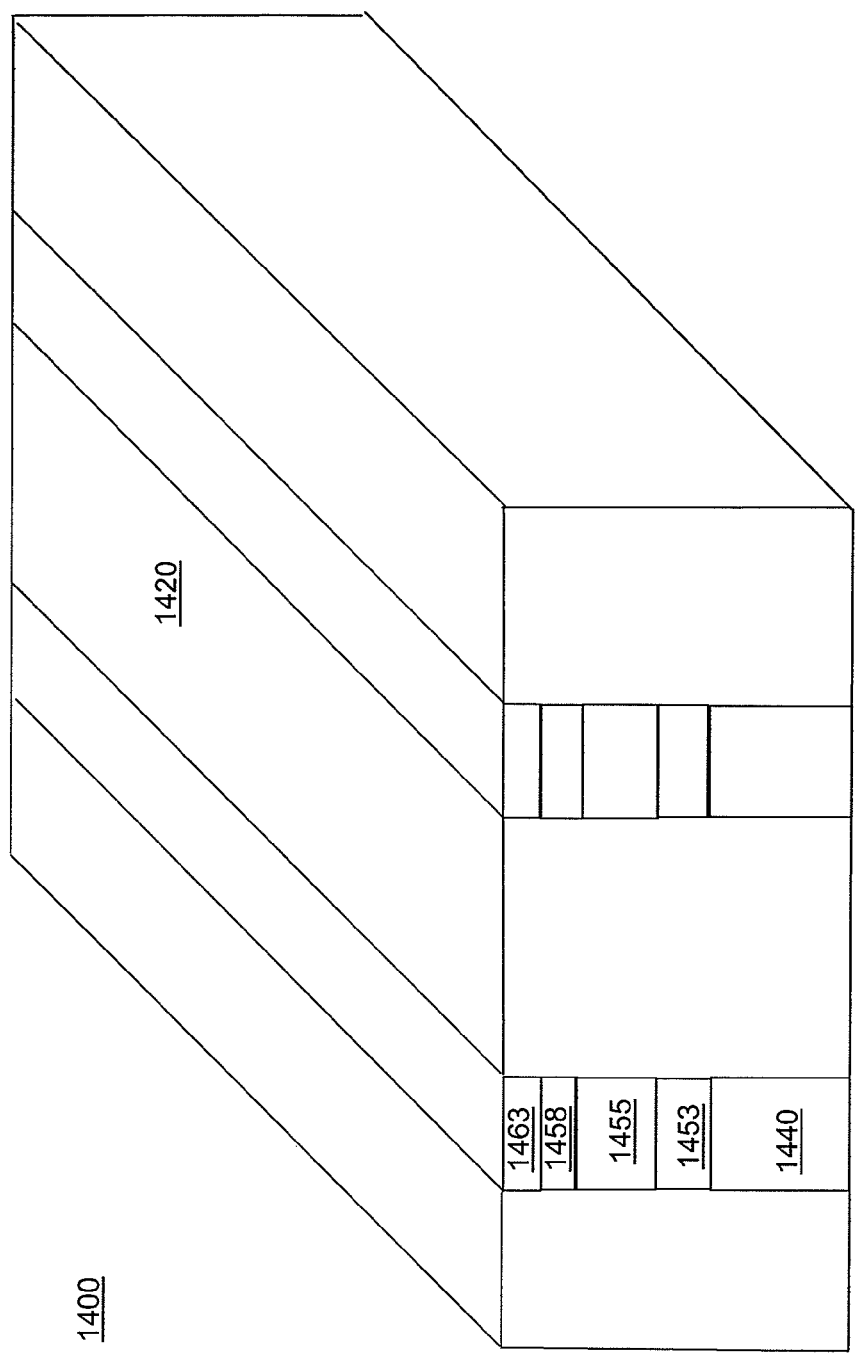

Continuing with process 1100, at block 1120, an isolation etch of film stack 1200 may be performed using a plasma etch process. Such an isolation etch may result in a self-aligned memory device active region and row metal structure, such as that shown in FIG. 13, for example. Adjacent lines 1370, which may be separated by isolation trench 1380, may comprise patterned row metal 1340, patterned memory bottom electrode 1353, patterned memory PCM 1355, patterned memory top electrode 1358, and either patterned switch bottom electrode or patterned sacrificial material. Subsequent to an isolation etch, sidewalls of isolation trench 1380 may be cleaned using a combination of plasma treatment, a wet chemical process, and/or thin film deposition, for example. At block 1130, a subsequent passivation process may comprise filling isolation trench 1380 with an insulating dielectric material using a deposition process comprising PECVD, CVD, ALD, or spin-on, just to name a few examples. Excess insulating dielectric material may then be removed using a chemical-mechanical polish in order to expose a top of the device structure, resulting in a structure 1400 having insulating material 1420, such as that shown in FIG. 14, for example. In one particular implementation, particular switch bottom electrode/sacrificial material, which may comprise a top layer of film stack 1200, for example, may be selected so that film stack layer 1200 may act as a polish stop, thus providing an opportunity to adjust a resulting height of structure 1400.

Figure 15:
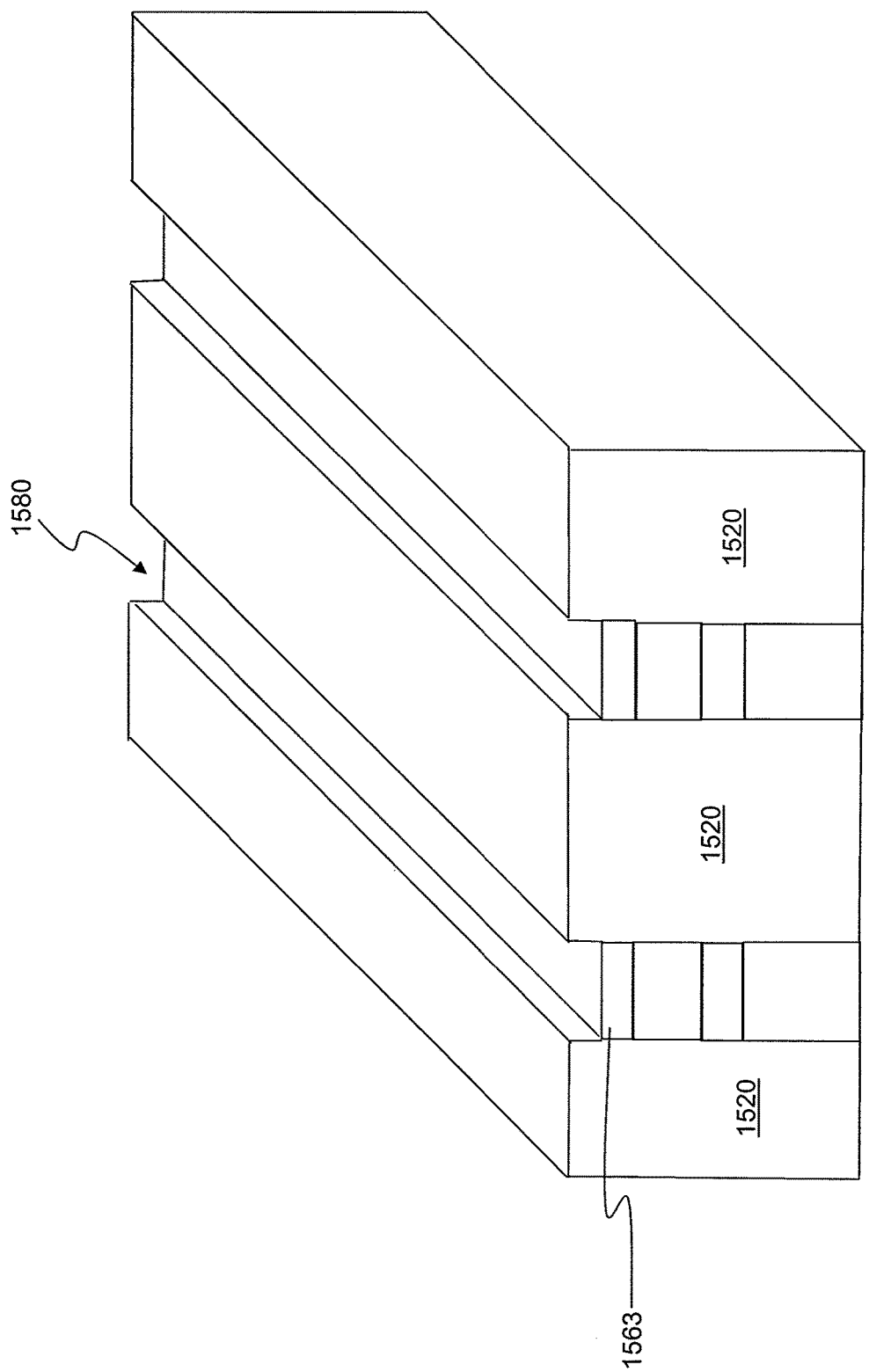

In a particular embodiment, if the top layer of structure 1400 comprises a sacrificial material, such as sacrificial material 1263, then such sacrificial material may be replaced with another material suitable for bottom switch electrode, as shown in FIG. 15. Such replacement may be performed using a process involving a plasma etch or a wet etch, replacement material deposition, and a subsequent chemical-mechanical polish. Such an optional replacement process may be used to separate selection of material suitable for a switch device electrode and selection of material suitable for an isolation oxide polish stop.

Figure 16:
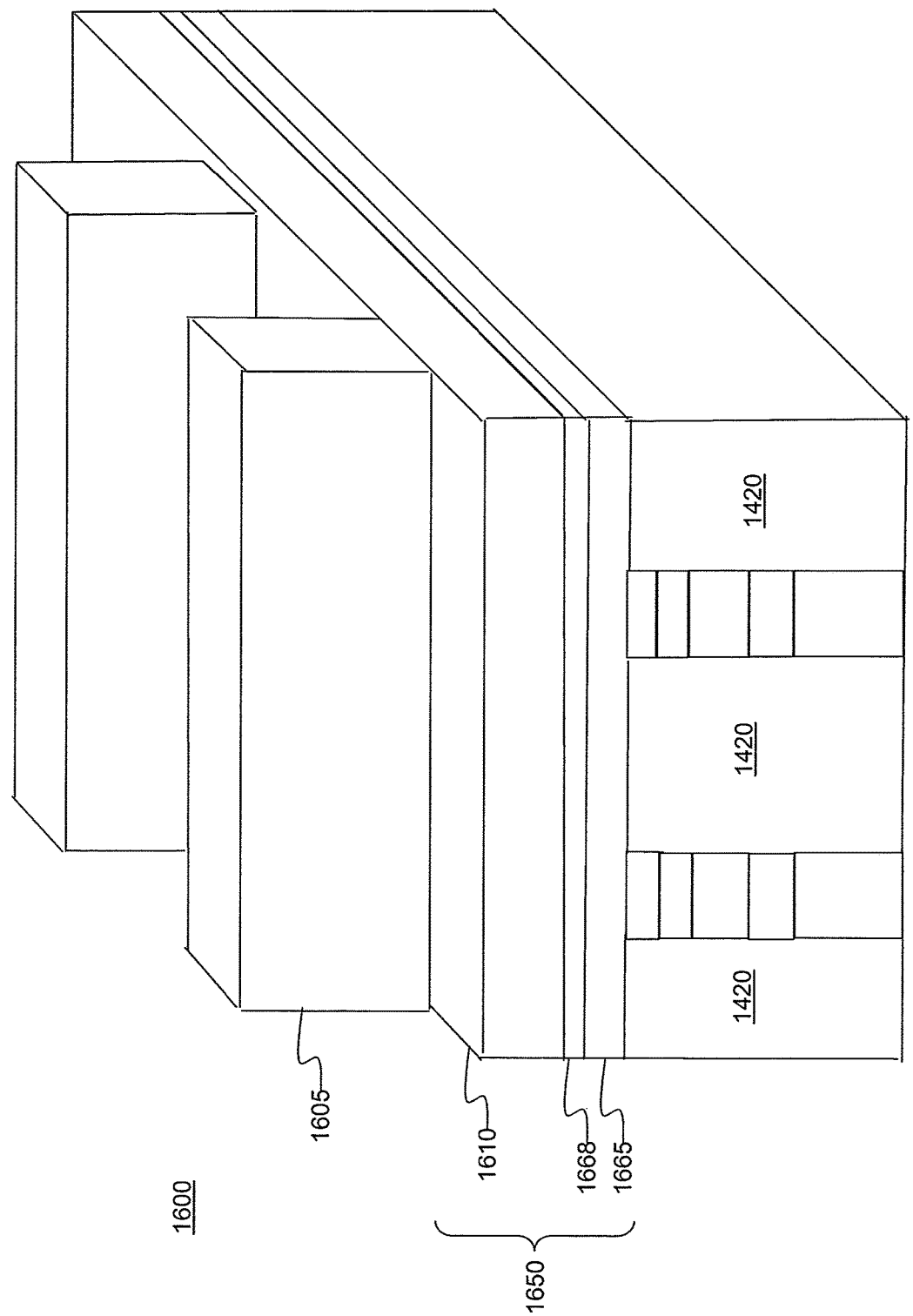

Continuing with process 1100, at block 1140, a composite film 1650 comprising switch PCM 1665, switch top electrode 1668, and column metal 1610 may be deposited on structure 1400. Subsequently, at block 1150, an etch mask may be deposited on top of such a film stack. Patterning such an etch mask into a set of lines 1605 may result in structure 1600, shown in FIG. 16, for example. At block 1160, process 1100 may next include applying an etching process to structure 1600 using lines 1605 as an etch mask. Such an etching process may etch composite film 1650 between lines 1605 to form trenches 1785 between switch devices 1705, shown in FIG. 17, for example. In one implementation, insulating material 1420 may act as an etch stop to such an etch process. Accordingly, such an etch process may terminate at a top of structure 1400 over insulating material 1420. However, such an etch process may continue to etch portions of structure 1400 between insulating material 1420, depending, at least in part, on a duration of the etching process. In particular, memory portion 1750 between insulating material 1420 may be etched below an upper surface of insulating material 1420. Depth of etch of memory portion 1750 may be adjusted in order to etch to various patterned layers of memory portion 1750. As mentioned above, such an adjustment may be performed by selecting a duration of the etching process, for example. Accordingly, by performing such an adjustment, structure 1600 may be formed into a particular PCMS cell, such as PCMS cells shown in FIGS. 5-10, as described in further detail below.

Figure 17:
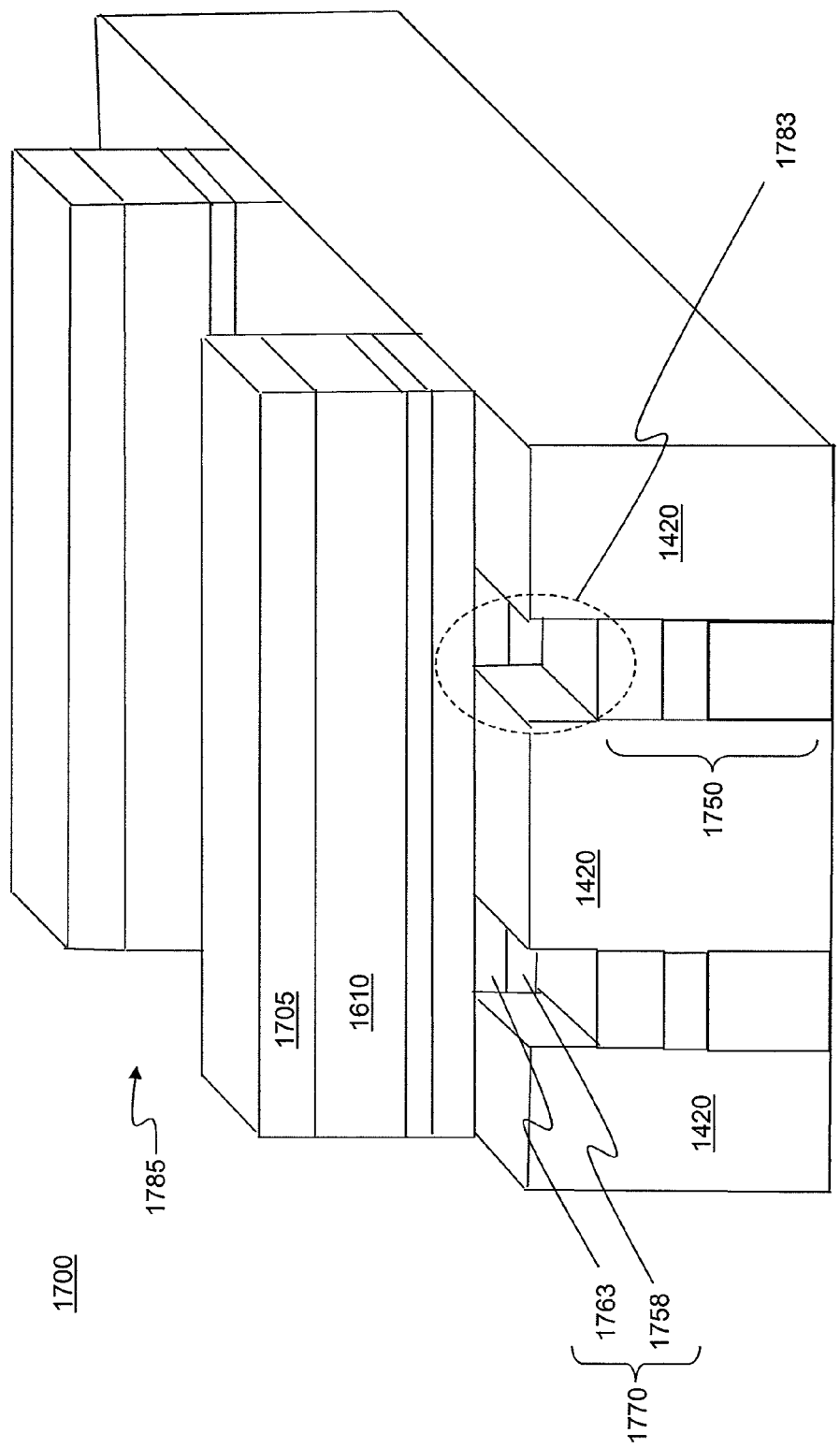
Figure 18:
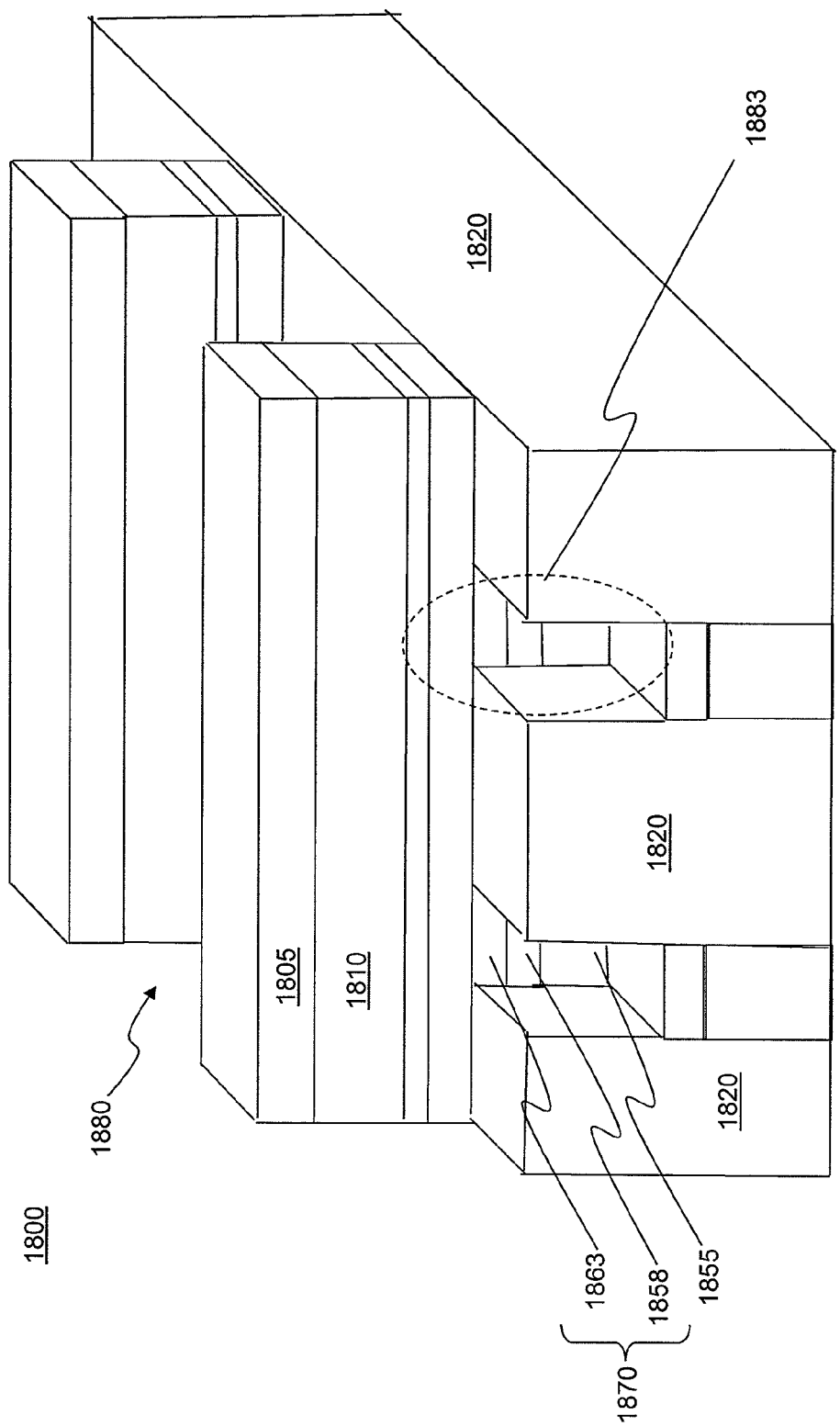
Figure 19:
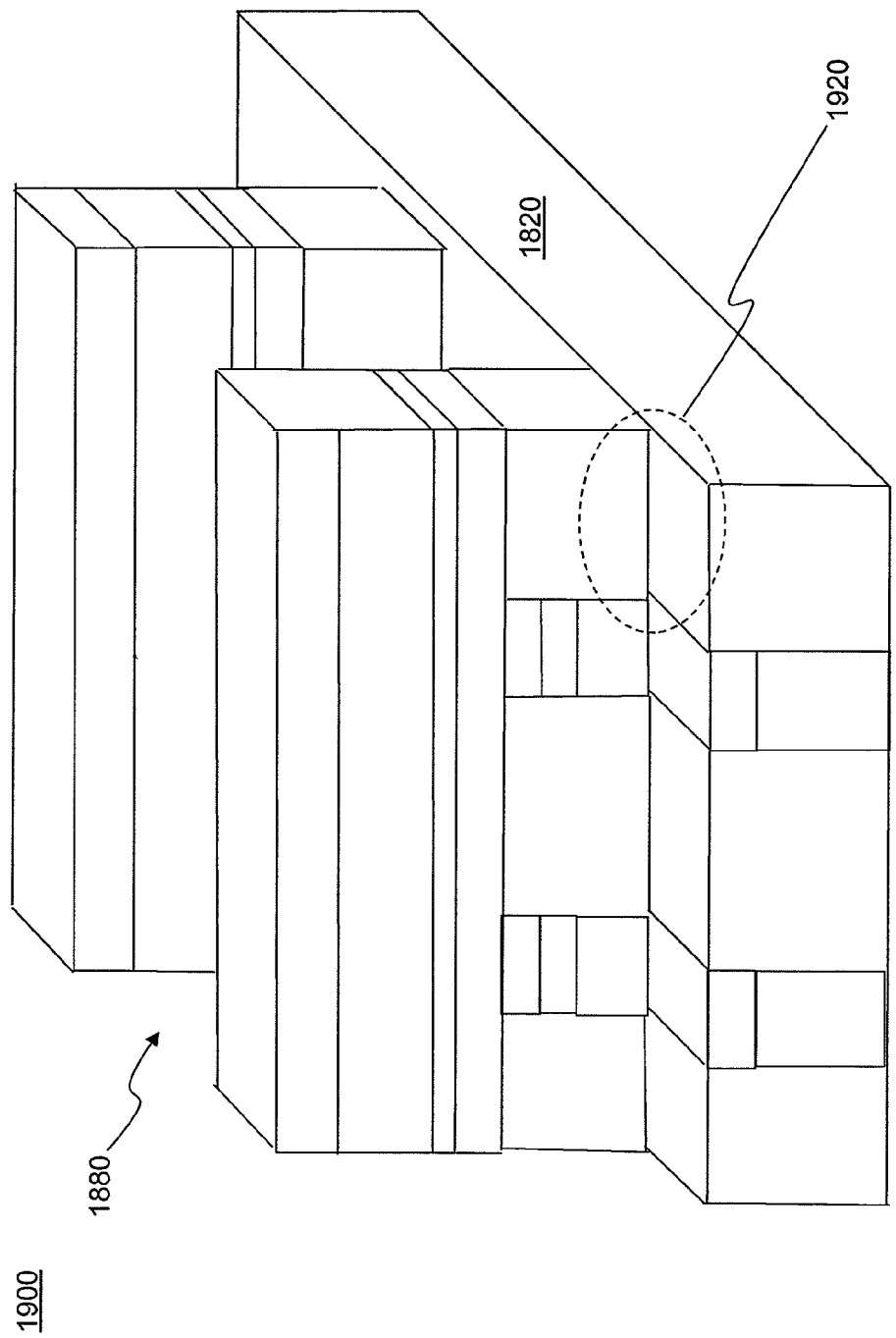

FIG. 17 shows a perspective view of structure 1700, wherein an etching process applied to structure 1600, such as that described for block 1160 in FIG. 11, may be used to isolate switch devices 1705 and middle electrodes 1770 comprising a switch bottom electrode 1763 and memory top electrode 1758, for example, as shown in FIG. 17. In a particular embodiment, such etching may be terminated after removing the middle electrodes 1770 to form a well 1783 in isolation trench 1780. Resulting structure 1700 may comprise PCMS cell 500, for example FIG. 18 shows a perspective view of structure 1800, wherein an etching process applied to structure 1600, such as that described for block 1160 in FIG. 11, may be used to isolate switch devices 1805, middle electrodes 1870, and memory PCM 1855. In detail, such switch devices may comprise a switch bottom electrode 1863 and memory top electrode 1858, for example, as shown in FIG. 18. In a particular embodiment, such etching may be terminated after removing memory PCM 1855 to form a well 1883 in isolation trench 1880. Resulting structure 1800 may comprise PCMS cell 600, for example. In a particular implementation, an additional etching process may be performed to address a difficulty in removing a relatively large portion of memory PCM from well 1883 inside isolation trench 1880. Such an additional etching process may include removing a portion 1920 of insulation 1820 in trench 1880, as shown in FIG. 19, for example.

Figure 20:
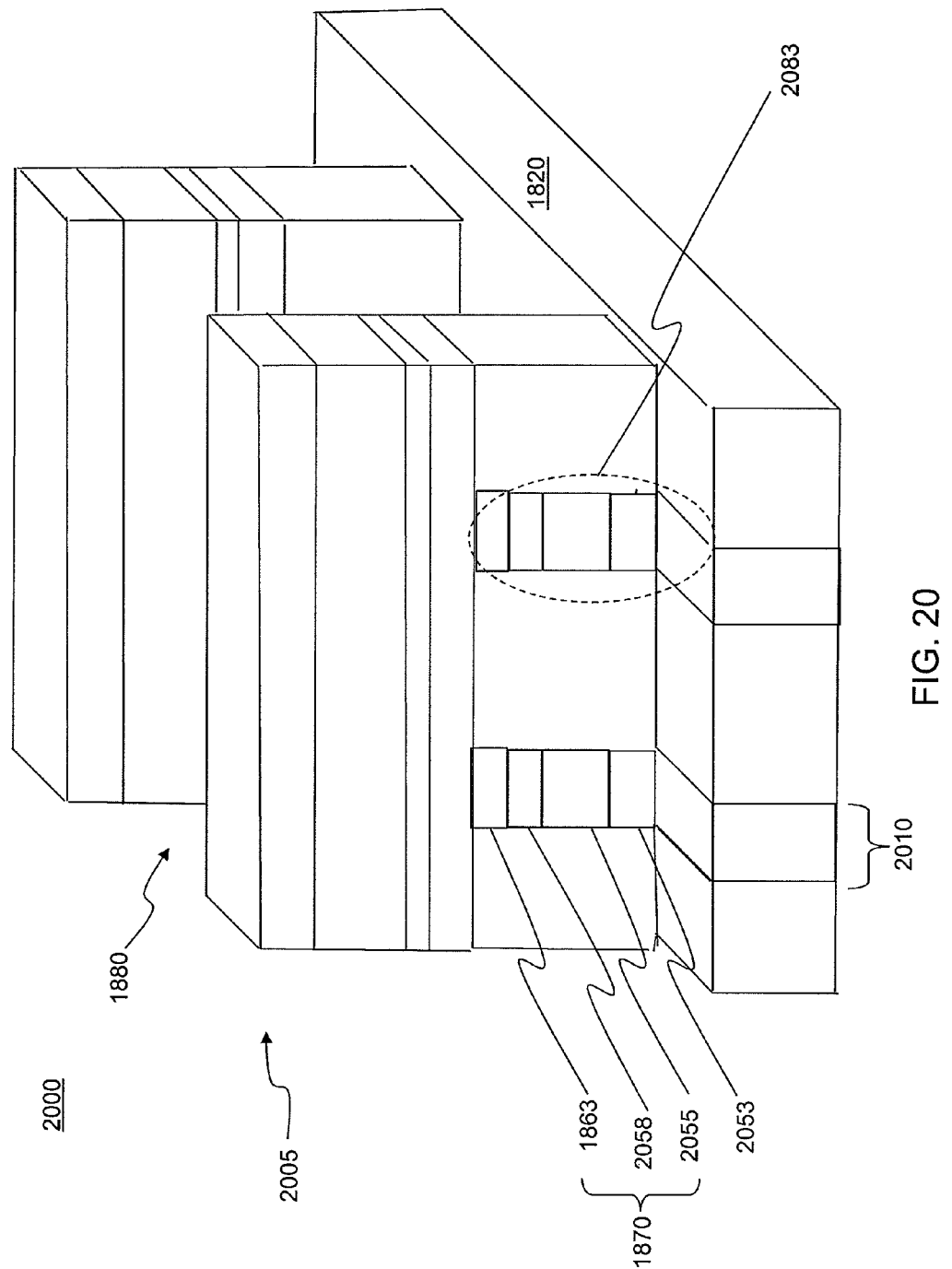

FIG. 20 shows a perspective view of structure 2000, wherein an etching process applied to structure 1600, such as that described for block 1160 in FIG. 11, may be used to isolate switch devices 2005, middle electrodes 2070, memory PCM 2055, and memory bottom electrode 2053. In detail, such switch devices may comprise a switch bottom electrode 2063 and memory top electrode 2058, for example, as shown in FIG. 20. In a particular embodiment, such etching may be terminated after removing memory bottom electrode 2053 to form a well 2083 in isolation trench 1880. Resulting structure 2000 may comprise PCMS cell 700, for example.

Figure 21:
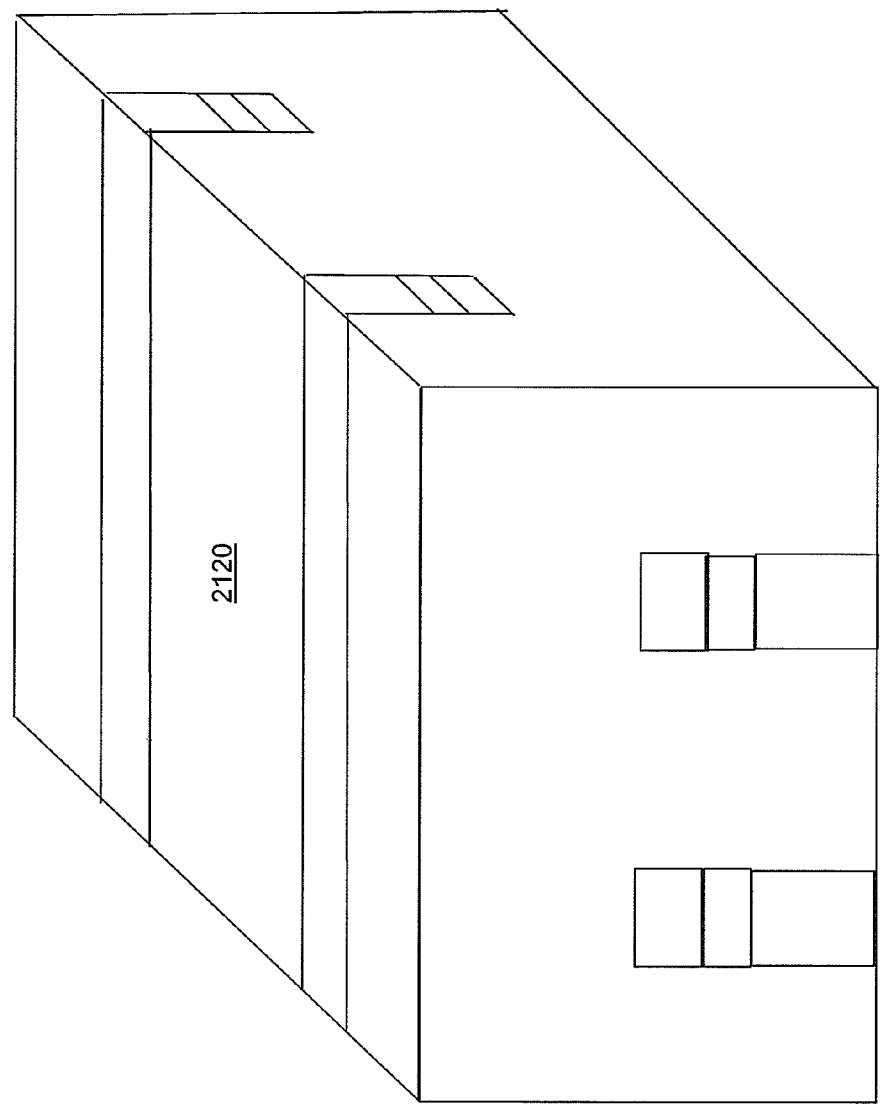
FIG. 21 shows a perspective view of PCMS cell, according to an embodiment.

FIG. 21 shows a perspective view of structure 2100, according to an embodiment. Structure 2100 may result from a process including cleaning sidewalls of isolation trenches 1880 and adding a passivation material such as by a combination of plasma treatment, wet chemical, and/or thin film deposition, for example. Accordingly, at block 1170 of process 1100, isolation trench 1880 between device structures may be filled with insulating dielectric material 2120. In one implementation, a method of filler deposition may comprise plasma-enhanced chemical vapor deposition (PECVD), chemical vapor deposition (CVD), atomic layer deposition (ALD), and/or a spin-on process, for example. Excess insulation material may be removed using a chemical-mechanical polish, exposing a top of the underlying device structure. Structure 2100 may comprise a portion of a cross-point array, such as that shown in FIGS. 1-3, for example. Of course, such details of process 1100 are merely examples, and claimed subject matter is not so limited.

Figure 22:
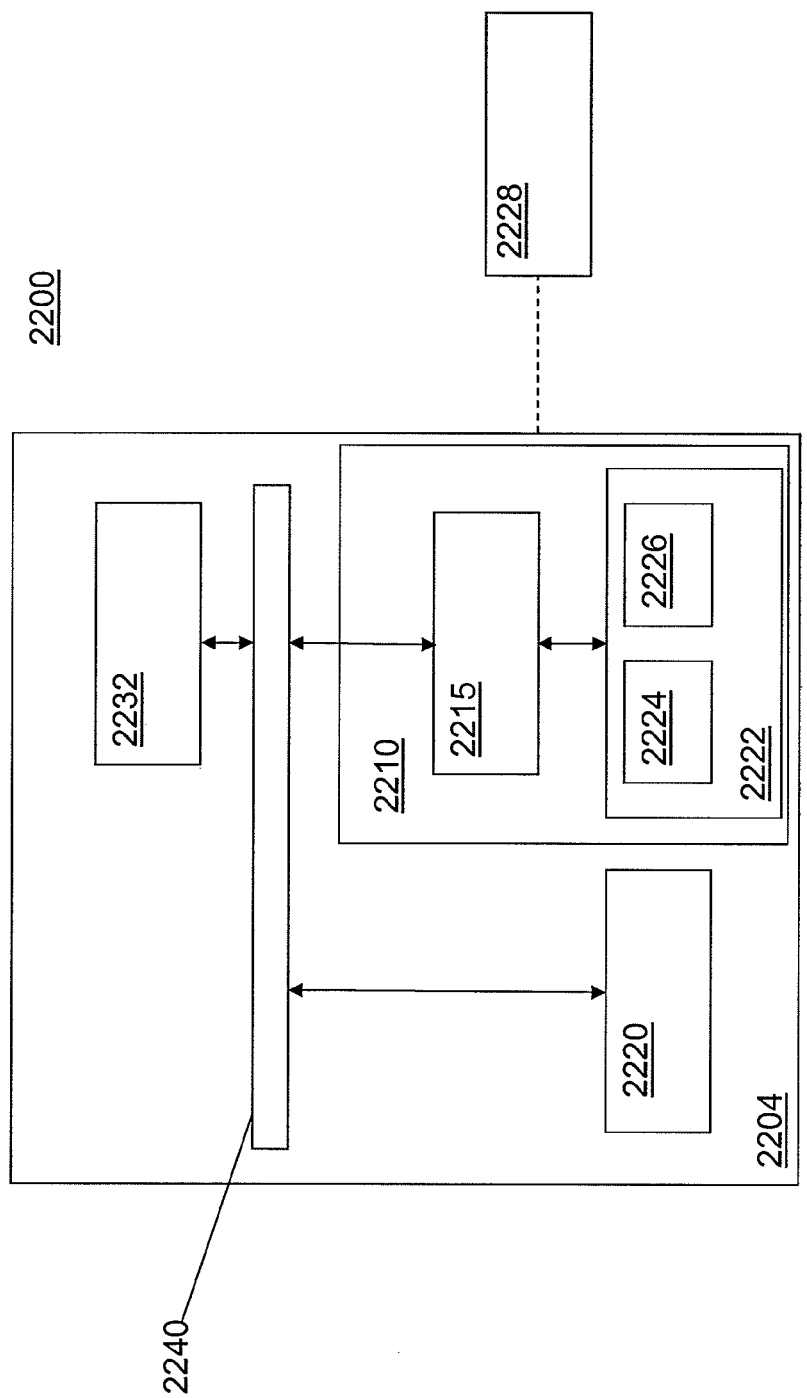
FIG. 22 is a schematic view of a computing system, according to an embodiment.

FIG. 22 is a schematic diagram illustrating an exemplary embodiment of a computing system 2200 including a memory device 2210. Such a computing device may comprise one or more processors, for example, to execute an application and/or other code. For example, memory device 2210 may comprise a memory that includes a cross-point array 100 of PCMS cells, shown in FIG. 1. A computing device 2204 may be representative of any device, appliance, or machine that may be configurable to manage memory device 2210. Memory device 2210 may include a memory controller 2215 and a memory 2222. By way of example but not limitation, computing device 2204 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 2200, and the processes and methods as further described herein, may be implemented using or otherwise including hardware, firmware, software, or any combination thereof. Thus, by way of example but not limitation, computing device 2204 may include at least one processing unit 2220 that is operatively coupled to memory 2222 through a bus 2240 and a host or memory controller 2215. Processing unit 2220 is representative of one or more circuits configurable to perform at least a portion of a data computing procedure or process. By way of example but not limitation, processing unit 2220 may include one or more processors, controllers, microprocessors, microcontrollers, application specific integrated circuits, digital signal processors, programmable logic devices, field programmable gate arrays, and the like, or any combination thereof. Processing unit 2220 may include an operating system configured to communicate with memory controller 2215. Such an operating system may, for example, generate commands to be sent to memory controller 2215 over bus 2240.

Memory 2222 is representative of any data storage mechanism. Memory 2222 may include, for example, a primary memory 2224 and/or a secondary memory 2226. Primary memory 2224 may include, for example, a random access memory, read only memory, etc. While illustrated in this example as being separate from processing unit 2220, it should be understood that all or part of primary memory 2224 may be provided within or otherwise co-located/coupled with processing unit 2220.

Secondary memory 2226 may include, for example, the same or similar type of memory as primary memory and/or one or more data storage devices or systems, such as, for example, a disk drive, an optical disc drive, a tape drive, a solid state memory drive, etc. In certain implementations, secondary memory 2226 may be operatively receptive of, or otherwise configurable to couple to, a computer-readable medium 2228. Computer-readable medium 2228 may include, for example, any medium that can carry and/or make accessible data, code, and/or instructions for one or more of the devices in system 2200.

Computing device 2204 may include, for example, an input/output 2232. Input/output 2232 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 2232 may include an operatively configured display, speaker, keyboard, mouse, trackball, touch screen, data port, etc.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A memory device comprising:
a plurality of memory structures, each of the plurality of memory structures comprising a phase change memory layer between a first memory electrode layer and a second memory electrode layer; and
a plurality of switch structures over the plurality of memory structures, each of the plurality of switch structures intersecting with at least two of the plurality of memory structures, and each of the plurality of switch structures comprising a phase change switch layer, a first switch electrode layer, and a second switch electrode layer, and wherein the phase change switch layer is between the first switch electrode layer and the second switch electrode layer, and the first switch electrode layer is in contact with the second memory electrode layer,
wherein the phase change switch layer extends to at least two memory cells of the memory device, and
wherein the first memory electrode layer, the phase change memory layer, the second memory electrode layer, and the first switch electrode layer are substantially localized at cross-points of the plurality of memory structures and the plurality of switch structures, and are isolated from immediately neighboring cross-points.

2. The memory device of claim 1, wherein the plurality of switch structures and the plurality of memory structures are on horizontal levels between a first plurality of electrically conductive lines and a second plurality of electrically conductive lines, wherein the first plurality of electrically conductive lines and the second plurality of electrically conductive lines are configured to interconnect memory cells of the memory device.

3. The memory device of claim 2, wherein the first plurality of electrically conductive lines is in contact with the plurality of memory structures and comprises a first plurality of metal lines, and wherein the second plurality of electrically conductive lines is in contact with the plurality of switch structures and comprises a second plurality of metal lines.

4. The memory device of claim 1, wherein the second switch electrode layer extends to at least two memory cells of the memory device.

5. The memory device of claim 1, wherein the first switch electrode layer and the second switch electrode layer comprise at least one of titanium nitride (TiN) and carbon.

6. The memory device of claim 1, wherein the first plurality of conductive lines is in contact with the second switch electrode layer and the second plurality of conductive lines is in contact with the first memory electrode layer.

7. The memory device of claim 1, wherein the first memory electrode layer and the second memory electrode layer comprise at least one of titanium nitride (TiN) and carbon.

8. A system comprising:
 a memory device comprising a memory array, wherein the memory array comprises:
  a plurality of memory structures in an array configuration, each of the plurality of memory structures comprising a phase change memory layer between a first memory electrode layer and a second memory electrode layer; and
  a plurality of substantially parallel switch structures over the plurality of memory structures, each of the plurality of substantially parallel switch structures intersecting with at least two of the plurality of memory structures, and each of the plurality of substantially parallel switch structures comprising a phase change switch layer, a first switch electrode layer and a second switch electrode layer, and wherein the phase change switch layer is between the first switch electrode layer and the second switch electrode layer, and the first switch electrode layer is in contact with the second memory electrode layer, wherein the phase change switch layer extends to at least two memory cells of the memory array, and
  wherein the first memory electrode layer, the phase change memory layer, the second memory electrode layer, and the first switch electrode layer are substantially localized at cross-points of the plurality of memory structures and the plurality of substantially parallel switch structures, and are isolated from immediately neighboring cross-points;
 a memory controller configured to access the memory array; and
 a processor to host one or more applications and to initiate commands to the memory controller to provide access to the memory array.

9. The system of claim 8, further comprising a first plurality of conductive lines and a second plurality of conductive lines, wherein the plurality of substantially parallel switch structures and the plurality of memory structures are on horizontal levels between the first plurality of electrically conductive lines and the second plurality of electrically conductive lines.

10. The system of claim 9, wherein the first electrically conductive lines and the second electrically conductive lines are configured to provide electrical communication between the memory controller and the memory array.

11. The system of claim 9, wherein the first plurality of electrically conductive lines is in contact with the plurality of memory structures and comprises a first plurality of metal lines, and wherein the second plurality of electrically conductive lines is in contact with the plurality of substantially parallel switch structures and comprises a second plurality of metal lines.

12. The system of claim 8, wherein the first memory electrode layer and the second memory electrode layer comprise at least one of titanium nitride (TiN) and carbon.

13. The system of claim 8, wherein the second switch electrode layer extends to at least two memory cells of the memory array.

14. The system of claim 8, wherein the first switch electrode layer and the second switch electrode layer comprise at least one of titanium nitride (TiN) and carbon.

* * * * *